(12) United States Patent
Kulkarni et al.

(10) Patent No.: US 11,751,361 B2
(45) Date of Patent: Sep. 5, 2023

(54) SYSTEMS AND METHODS FOR DATACENTER THERMAL MANAGEMENT

(71) Applicant: Microsoft Technology Licensing, LLC, Redmond, WA (US)

(72) Inventors: Ashish Arvind Kulkarni, Redmond, WA (US); Prajakta Ashish Kulkarni, Redmond, WA (US)

(73) Assignee: Microsoft Technology Licensing, LLC, Redmond, WA (US)

( * ) Notice: Subject to any disclaimer, the term of this patent is extended or adjusted under 35 U.S.C. 154(b) by 33 days.

(21) Appl. No.: 17/337,120

(22) Filed: Jun. 2, 2021

(65) Prior Publication Data

US 2022/0394888 A1 Dec. 8, 2022

(51) Int. Cl.
 *H05K 7/20* (2006.01)

(52) U.S. Cl.
 CPC ....... *H05K 7/20836* (2013.01); *H05K 7/2039* (2013.01); *H05K 7/20154* (2013.01); *H05K 7/20745* (2013.01)

(58) Field of Classification Search
 CPC ........... H05K 7/20745; H05K 7/20836; H05K 7/20154; H05K 7/2039; H05K 7/20736; H05K 7/1497; H05K 7/20827; H05K 7/20709; H05K 7/20754
 See application file for complete search history.

(56) References Cited

U.S. PATENT DOCUMENTS

| | | | |
|---|---|---|---|
| 8,503,179 B2 | 8/2013 | Tan et al. | |
| 8,693,198 B2 | 4/2014 | Eckberg et al. | |
| 9,137,930 B2 * | 9/2015 | Alshinnawi | H05K 7/20745 |
| 2003/0221817 A1 * | 12/2003 | Smith | G06F 1/20 174/16.3 |
| 2005/0207116 A1 | 9/2005 | Yatskov et al. | |
| 2010/0033931 A1 * | 2/2010 | Miyazawa | H05K 7/20745 29/890.03 |
| 2010/0319883 A1 * | 12/2010 | Facusse | H05K 7/20827 165/47 |

(Continued)

FOREIGN PATENT DOCUMENTS

| | | |
|---|---|---|
| CN | 103699196 B | 5/2018 |
| CN | 210610106 U | 5/2020 |

(Continued)

OTHER PUBLICATIONS

Bell, Geoffreyc. , "Data Center Rack Cooling with Rear-door Heat Exchanger", Retrieved from: https://datacenters.lbl.gov/sites/all/files/rdhx-doe-femp.pdf, Jun. 2010, 4 Pages.

(Continued)

*Primary Examiner* — Adam B Dravininkas
(74) *Attorney, Agent, or Firm* — RAY QUINNEY & NEBEKER P.C.; Paul N. Taylor

(57) ABSTRACT

A thermal management system for cooling a computing device includes a cold aisle, a hot aisle, a radiator, and a plurality of source heat sinks thermally conductively connected to the radiator. The radiator connects the cold aisle to the hot aisle and flows a cooling fluid through an interior volume of the radiator. Each source heat sink is configured to connect to a heat-generating electronic component to thermally conductively connect the heat-generating component to a surface of the radiator.

20 Claims, 6 Drawing Sheets

(56) References Cited

U.S. PATENT DOCUMENTS

| | | | |
|---|---|---|---|
| 2011/0182028 A1* | 7/2011 | Tan | G06F 1/20 361/679.46 |
| 2011/0317367 A1* | 12/2011 | Campbell | H05K 7/203 361/700 |
| 2012/0281359 A1 | 11/2012 | Arney et al. | |
| 2013/0021746 A1* | 1/2013 | Campbell | H05K 7/20827 165/104.13 |
| 2014/0326436 A1 | 11/2014 | Czamara et al. | |
| 2021/0084793 A1 | 3/2021 | Gao | |

FOREIGN PATENT DOCUMENTS

| | | |
|---|---|---|
| EP | 2681979 B1 | 3/2015 |
| EP | 3648561 A1 | 5/2020 |
| JP | 2015146189 A | 8/2015 |

OTHER PUBLICATIONS

"International Search Report & Written Opinion issued in PCT Application No. PCT/US22/028249", dated Aug. 19, 2022, 18 Pages.

\* cited by examiner

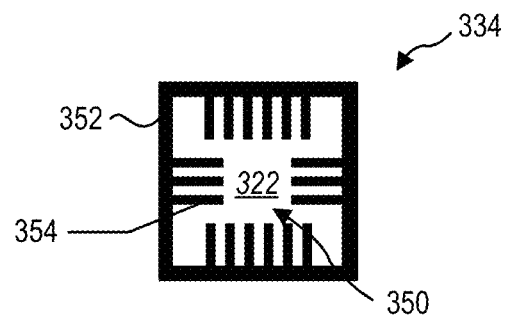
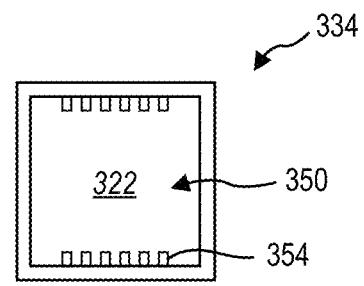
FIG. 3-1    FIG. 3-2
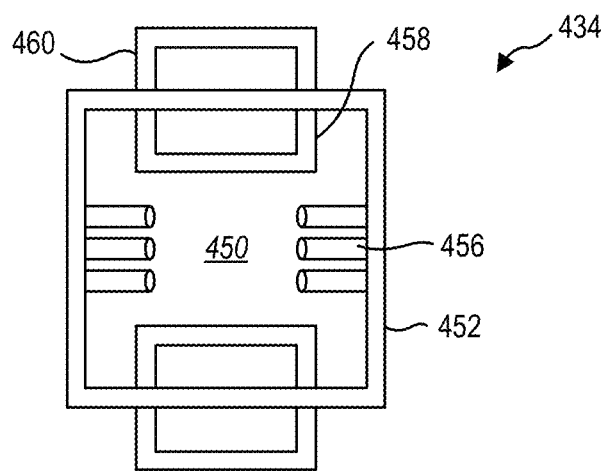
FIG. 4

SYSTEMS AND METHODS FOR DATACENTER THERMAL MANAGEMENT

BACKGROUND

Background and Relevant Art

As information technology equipment has changed, higher cooling capacity solutions are needed to support the computing power for Artificial Intelligence and Machine Learning applications. Air cooling requires airflow to carry away thermal energy from the higher power chips, and a fan failure or blockage can stop airflow to an entire row or rack of devices. Liquid cooled systems using cold plate technology come with a potential failure in leaks causing hardware damage and unsafe working conditions.

BRIEF SUMMARY

In some embodiments, a thermal management system for cooling a computing device includes a cold aisle, a hot aisle, a radiator, and a plurality of source heat sinks thermally conductively connected to the radiator. The radiator connects the cold aisle to the hot aisle and flows a cooling fluid through an interior volume of the radiator. Each source heat sink is configured to connect to a heat-generating electronic component to thermally conductively connect the heat-generating component to a surface of the radiator.

In some embodiments, a thermal management system includes a cold aisle, a hot aisle, a radiator, a plurality of source heat sinks thermally conductively connected to the radiator, and an ambient fan positioned and configured to blow ambient air toward at least one of the source heat sinks. The radiator connects the cold aisle to the hot aisle and flows a cooling fluid through an interior volume of the radiator. Each source heat sink is configured to connect to a heat-generating electronic component to thermally conductively connect the heat-generating component to a surface of the radiator.

In some embodiments, a thermal management system for cooling computing devices includes a cold aisle, a hot aisle, a radiator, and a plurality of server blades. The radiator connects the cold aisle to the hot aisle and flows a cooling fluid through an interior volume of the radiator. Each server blade of the plurality of server blades includes a heat-generating component, a source heat sink, and an ambient fan. The source heat sink is positioned on the heat-generating component and thermally conductively connected to the radiator. The ambient fan is positioned and configured to blow ambient air toward at least one of the source heat sinks.

This Summary is provided to introduce a selection of concepts in a simplified form that are further described below in the Detailed Description. This Summary is not intended to identify key features or essential features of the claimed subject matter.

Additional features and advantages will be set forth in the description which follows, and in part will be obvious from the description, or may be learned by the practice of the teachings herein. Features and advantages of the disclosure may be realized and obtained by means of the instruments and combinations particularly pointed out in the appended claims. Features of the present disclosure will become more fully apparent from the following description and appended claims or may be learned by the practice of the disclosure as set forth hereinafter.

BRIEF DESCRIPTION OF THE DRAWINGS

In order to describe the manner in which the above-recited and other features of the disclosure can be obtained, a more particular description will be rendered by reference to specific embodiments thereof which are illustrated in the appended drawings. For better understanding, the like elements have been designated by like reference numbers throughout the various accompanying figures. While some of the drawings may be schematic or exaggerated representations of concepts, at least some of the drawings may be drawn to scale. Understanding that the drawings depict some example embodiments, the embodiments will be described and explained with additional specificity and detail through the use of the accompanying drawings in which:

FIG. 3-1 is a transverse cross-sectional view of a radiator, according to at least some embodiments of the present disclosure;

FIG. 3-2 is a transverse cross-sectional view of the radiator of FIG. 3-1 at a different longitudinal location;

FIG. 4 is a transverse cross-sectional view of another radiator, according to at least some embodiments of the present disclosure;

DETAILED DESCRIPTION

The present disclosure relates generally to systems and methods for protecting electronic devices from thermal damage. More particularly, the present disclosure relates to devices, systems, and methods for cooling server blades using a radiator to air cool select components, such as a central processing unit (CPU) or memory (random access memory) of a server blade. In some embodiments, a central column radiator with a closed cold aisle connection is used in conjunction with ambient fans that blow ambient air over the remainder of the server blade.

Datacenters include a plurality of electronic devices, some of which are computing devices, that all generate thermal energy. The thermal energy needs to be transported away from the electronic devices to prevent damage to the electronic devices and/or protect the integrity of the data stored or computed on the electronic devices. Datacenters use thermal management systems to carry thermal energy away from the electronic devices by liquid cooling, air cooling, or a combination thereof. Even in liquid cooled systems, the liquid cooling may efficiently conduct thermal energy from the electronic devices but ultimately reject the thermal energy from the warmed fluid (e.g., liquid or vapor) into the ambient atmosphere. The warmed ambient air must then be moved from the liquid cooling system and/or the electronic devices to complete the thermal management of the electronic devices, which may be inefficient.

In some embodiments of datacenters and thermal management systems according to the present disclosure, a plurality of heat generating devices are located in an enclosed space and air is moved through a radiator to transfer heat from the heat-generating devices to cool the heat-generating devices. While the present disclosure will describe the use of airflow to cool heat-generating devices directly, such as cooling computing devices, hardware storage devices, networking devices, power supplies, and other electronic devices, it should be understood that the thermal management system may use liquid cooling fluid flow to cool heat sinks of heat-generating components. In some embodiments, the column radiator is subcooled below the ambient air temperature, and select heat-generating components are thermally conductively connected to the radiator to conductively exhaust waste heat from the heat-generating component.

Figure 1:
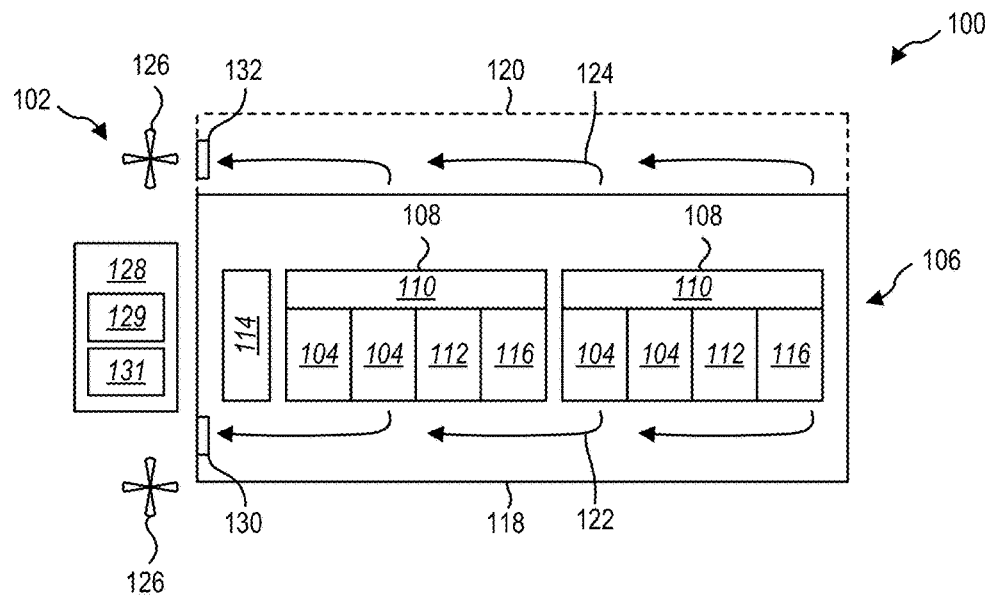
FIG. 1 is a schematic representation of a datacenter with a thermal management system, according to at least some embodiments of the present disclosure.

FIG. 1 is a schematic representation of a conventional datacenter 100 with a thermal management system 102. An example environment in which thermal management systems and methods according to the present disclosure may be used is a server array. In some embodiments, the datacenter 100 includes server computers 104 arranged in a row 106, where the row contains a plurality of server racks 108, each of which contain a plurality of server computers 104, power supplies 110, networking devices 112, and other electronic devices. In some examples, the server computer 104 is a blade server. In some examples, the server computers are complete computers (e.g., each server computer can function as a standalone computer). In some examples, the server computers 104 are electronic components that can cooperate to provide scalable computational power.

The server row 106 can include a row manager 114 that is in communication with the server racks and/or rack manager 116 of the server row 106. In some embodiments, the row manager 114 controls computational loads, such as process allocations, of the server racks 108 and/or server computers 104. In doing so, the row manager 114 may control the amount of heat generated by the server computers 104 of the server racks 108. In some embodiments, the row manager 114 controls thermal management of the server racks and/or server computers. For example, the row manager 114 can manage active thermal management for the server racks 108 and/or server computers 104 by changing fan speed or by controlling the flow rate of a cooling fluid for liquid cooling systems. In at least one example, the server row 106 is at least partially cooled by a liquid cooling system that delivers cooling fluid to the server racks 108 of the server row 106. The row manager 114 is in communication with the cooling fluid pump to change or stop the flow of cooling fluid.

A server rack 108 can support a plurality of server computers 104 in the rack. The server computers may each have liquid cooling, such as localized immersion cooling, for at least some electronic components of the server computer, or a cooling plate with recirculating cooling fluid to cool the electronic component(s) of the server computer. In some embodiments, the server computers 104 or other electronic devices may be air-cooled, utilizing a cold aisle 118 and a hot aisle 120 that flow colder air 122 from the cold aisle 118 and evacuate hotter air 124 from the electronic devices through the hot aisle 120. The air flows from the cold aisle 118 to the hot aisle 120 based on air pressure differentials established by pumps or blowers 126 of the thermal management system in series with the cold aisle 118 and the hot aisle 120.

In some embodiments, the electronic components, such as server computers 104, of the server rack 108 are connected to a rack manager 116. The rack manager 116 may control power delivery to the server computers 104 or other electronic components. In some embodiments, the rack manager 116 may communicate with the server computers 104 or other electronic components to power cap or throttle the server computers 104 or other electronic components and manage power draw. The rack manager 116, in some embodiments, is also connected to a cooling fluid pump that moves cooling fluid to one or more server computers or other electronic components in the server rack.

A system resource manager 128 may be connected to the row manager 114 and/or rack manager(s) 116 to communicate with the electronic devices, as well as be connected to thermal sensors 130, 132 to measure one or more properties of the thermal management system 102. In some embodiments, the resource manager 128 is the row manager 114. In some embodiments, the resource manager 128 is the rack manager 116. In some embodiments, the resource manager 128 is a dedicated controller.

The system resource manager 128 includes a processor 129 and a hardware storage device 131. The processor 129 may receive information from the thermal sensors 130, 132 and communicate with one or more other devices according to instructions stored on the hardware storage device 131 that cause the processor to perform any of the methods described herein. In some embodiments, the devices in communication with the system resource manager 128 may receive instructions from the system resource manager 128 in response to detecting an increase in temperature include a cooling fluid pump, fan, valve, another thermal management device (e.g., blower 126), or combinations thereof. For example, the system resource manager 128 may adjust the flow of cooling fluid by turning on the cooling fluid pump or by actuating a valve to direct airflow.

The hardware storage device 131 can be any non-transient computer readable medium that may store instructions thereon. The hardware storage device 131 may be any type of solid-state memory; volatile memory, such as static random access memory (SRAM) or dynamic random access memory (DRAM); non-volatile memory, such as read-only memory (ROM) including programmable ROM (PROM), erasable PROM (ERPOM) or EEPROM; magnetic storage media, such as magnetic tape; a platen-based storage device, such as hard disk drives; optical media, such as compact discs (CD), digital video discs (DVD), Blu-ray Discs, or other optical media; removable media such as USB drives; non-removable media such as internal SATA or non-volatile memory express (NVMe) style NAND flash memory; or any other non-transient storage media.

The air 122 is provided to the entire row 106 and/or rack 108 to cool the ambient air around the components of the rack 108. Cooling the entire environment may not be necessary and, in fact, inefficient, when the heat generation by the components of the server computers 104 and other electronic devices is uneven. For example, a central processing unit (CPU) or system memory of the server computer 104 may generate considerably greater heat than a non-volatile storage device. To limit and/or prevent thermal damage to the CPU, however, the entire ambient air is cooled based off of the CPU temperature and load. Localized cooling can efficiently cool the hottest areas and/or components without expending additional energy to cool the entire room in which the row 106 or rack 108 is located.

In some embodiments, a thermal management system according to the present disclosure provides localized cooling for the greatest heat-generating components of the server blades. A hybrid thermal management system uses a shared radiator to provide a subcooled heat sink in addition to the ambient air. In some embodiments, the radiator has an interior volume through which subcooled air or other gas flows to cool the radiator. In some embodiments, a cooling liquid is pumped through the radiator to cool the radiator. Select heat-generating components, such as processors (e.g., CPU, graphical processing unit (GPU)), system memory (e.g., RAM), network connection devices, and power supplies, are thermally conductively connected to the radiator to conduct heat away from the components to the cold radiator. The rest of the components, which generate less heat, on the motherboard are cooled via ambient air and/or fans to blow ambient air across those components.

Figure 2:
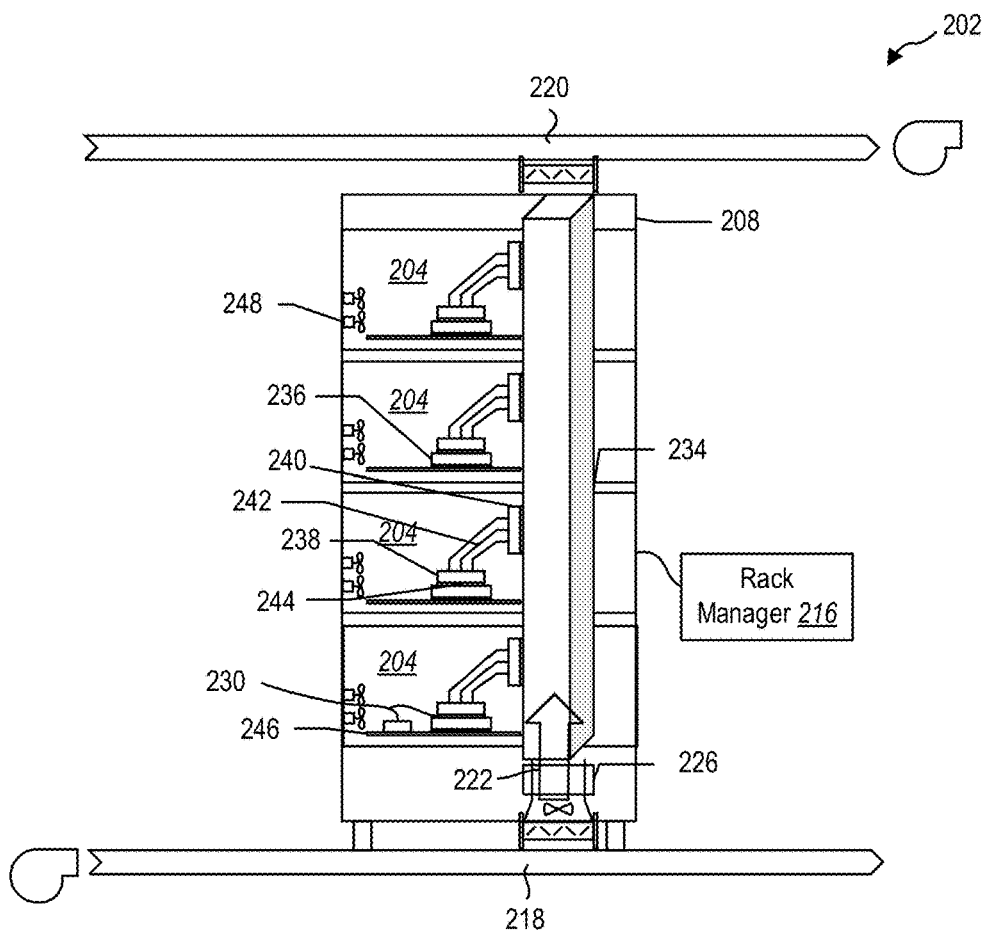
FIG. 2 is a side view of a hybrid radiator thermal management system, according to at least some embodiments of the present disclosure.

FIG. 2 is a side schematic representation of a thermal management system 202 including a rack 208 of server computers or server blades 204. A rack manager 216 or other controller is connected to thermal sensors 230 and control structures for controlling the flow of air 222 through the radiator 234. As described above, the radiator may be gas-cooled or liquid-cooled. While the present disclosure will describe the thermal management system as using air, it should be understood that other cooling fluids may be used. The air 222 flowing through the radiator 234 cools the radiator 234. In some embodiments, the radiator 234 connects the cold aisle 218 to the hot aisle 220. The air 222 warms as the radiator 234 receives heat from the heat-generating components, such as the CPU 236 of each blade 204. While FIG. 2 illustrates the radiator 234 oriented vertically to connect the cold aisle 218 to the hot aisle 220, the radiator 234 may be positioned at other orientations. For example, at least a portion of the radiator 234 may be oriented at an angle to the direction of gravity. In some examples, at least a portion of the radiator 234 may be oriented horizontally. In some examples, at least a portion of the radiator 234 may be curved or have a corner therein. In at least one example, the radiator 234 may provide cold air across a plurality of racks 208.

The heat-generating component, such as the CPU 236, is thermally conductively connected to the radiator 234 by a thermal conductor. In some embodiments, a thermal conductor is a solid structure that conducts heat from the heat-generating component to the radiator 234 within convective or radiative thermal interfaces. A thermally conductively connected element does not rely upon heat transfer through the air or other medium, but rather is physically connected to the radiator 234.

The thermal conductor includes at least one source heat sink 238 positioned in contact with the heat-generating component. In some embodiments, a thermal paste 244 or other interface material is positioned between the source heat sink 238 and the heat-generating component to fill gaps and/or provide a thermally efficient interface.

The source heat sink 238 may be thermally conductively connected to a radiator heat sink 240 in contact with the radiator 234. In some embodiments, the source heat sink 238 may be thermally conductively connected with the radiator 234 directly, such as having one or more thermal conductors integrally formed with the radiator 234. In some embodiments, the radiator heat sink 240 has an interface material positioned between the radiator heat sink 240 and the radiator 234.

In some embodiments, and as will be described in greater detail below, the source heat sink 238 is thermally conductively connected to the radiator 234 and/or radiator heat sink 240 by a thermal conductor. The thermal conductor may be or include a heat pipe, vapor chamber, solid thermally conductive rods or fins, other thermal conductors, or combinations thereof. In FIG. 2, each of the server blades 204 has a source heat sink 238 that is thermally conductively connected to a radiator heat sink 240 by heat pipes 242. In some embodiments, the source heat sink 238 is thermally conductively connected to the radiator heat sink 240 by a plurality of heat pipes 242 or other thermal conductors. In some embodiments, the source heat sink 238 is thermally conductively connected to the radiator heat sink 240 by a single heat pipe 242 or other thermal conductor. For example, the number and/or size of the thermal conductor may be related to the distance from the source heat sink 238 to the radiator 234 or radiator heat sink 240.

FIG. 2 also illustrates a rank manager 216 in communication with one or more components of the rack 208. In some embodiments, the rack manager 216 is the resource manager. In some embodiments, a dedicated controller is connected to one or more radiator blowers 226 and/or ambient fans 248. The radiator blower 226 may be positioned and/or configured to flow air (or other cooling fluid) through the radiator between the cold aisle 218 and the hot aisle 220. In some embodiments, the thermal management system 202 includes a plurality of radiator blowers 226, such as a first radiator blower 226 proximate the cold aisle 218 and a second radiator blower 226 proximate the hot aisle 220.

The ambient fans 248 may be positioned on or proximate to the blade 204 to blow ambient air across a surface of the motherboard 246 and/or lower heat-generating components of the server blade 204. For example, the server blade 204 may include non-volatile memory, such as a magnetic hard disk drive. The magnetic platen hard disk drive may require fewer cooling resources than the CPU 236, and the ambient air may provide sufficient cooling capacity to cool the magnetic platen hard disk drive without being thermally conductively connected to the radiator 234. In some embodiments, such as illustrated in FIG. 2, the ambient fan(s) 248 are positioned and oriented to blow ambient air from the room into the server blade 204 and toward the radiator 234. In at least one embodiment, the ambient fan 248 is positioned proximate the radiator 234 to blow ambient air cooled by the surface of the radiator 234 away from the radiator 234 across the server blade 204 and/or motherboard 246 to cool the motherboard 246 and components thereon.

The rack manager 216 or other resource manager controller may be in communication with the thermal sensor(s) 230 and adjust the radiator blower 226 and/or ambient fans 248 according to measurements from the thermal sensor(s) 230. For example, the CPU 236 is passively thermally conductively connected to the radiator 234, and additional cooling capacity to the CPU 236 can be provided by using the radiator 234 to generate cooler air and to increase the temperature gradient across the thermal conductor (e.g., heat pipes 242). If a thermal sensor 230 positioned on the CPU 236 or on an interface with the CPU 236 measures a CPU temperature approaching or exceeding a threshold temperature, the rack manager 216 or other resource manager controller may send a signal to the radiator blower 226 to increase the flow of air 222 through the radiator 234 from the cold aisle 218 to further cool the radiator 234.

In another example, a thermal sensor 230 positioned on the motherboard 246 may measure a motherboard temperature that is approaching or exceeding a threshold temperature. The rack manager 216 or other resource manager controller may send a signal to the ambient fan(s) 248 to blow ambient air across the motherboard 246 and/or other components toward or away from the radiator 234 to cool the motherboard 246 and/or other components.

In some embodiments, the radiator heat sink 240 is selectively connected to the radiator 234, allowing the radiator heat sink 240 and the server blade 204 to be removed (e.g., disconnected) from the radiator 234 and/or rack 208 for replacement or maintenance. For example, the server blade 204 may slide into the rack 208 toward the radiator 234 during installation and/or may be removed from the rack 208 away from the radiator 234. The server blade 204 may include a source heat sink 238 and radiator heat sink 240 installed on the server blade 204. When the server blade 204 is pushed into the rack 208, the server blade 204 may electrically connect to a power supply and/or networking components (such as described in relation to FIG. 1) and, at the same time, connect the radiator heat sink 240 to the radiator 234.

To provide efficient convective heat transfer between the air 222 in the interior volume of the radiator 234 and the radiator walls, the radiator 234 may include one or more thermal surface features to increase surface area of an inner or outer surface of the radiator 234. FIGS. 3-1 and 3-2 are transverse cross-sectional views of an embodiment of a radiator 334. In some embodiments, the radiator 334 has an interior volume 350 through which the air 322 from the cold aisle flows. The air 322 from the cold aisle cools the radiator walls 352 to which a radiator heat sink or thermal conductor may be connected. The radiator 334 includes one or more thermal surface features to increase the surface area of the inner surface of the radiator walls 352 and more efficiently transfer heat between the air 322 and radiator walls 352 and cool the radiator walls 352. In some embodiments, the thermal surface features include fins 354 oriented in the longitudinal direction of the radiator 334 (e.g., the direction of airflow through the interior volume 350). By orienting the fins 354 in the direction of airflow, the resistance to the air 322 is minimized while exposing a larger surface area of the fins 354 to the air 322.

In some embodiments, the air 322 warms as the air flows through the radiator 334, which decreases the temperature gradient between the air 322 and the radiator 334. A decrease in the temperature gradient can decrease heat transfer rates. To compensate for the warming of the air along the longitudinal length of the radiator 334, the thermal surface features can vary in size, shape, or type along the longitudinal direction of the radiator 334. For example, FIG. 3-2 is a transverse cross-sectional view of the same radiator 334 of FIG. 3-1 at a different longitudinal position in the radiator 334. FIG. 3-2 illustrates the radiator 334 proximate the cold aisle, where the air 322 is coldest in the radiator 334. The fins 354 are shorter (e.g., protrude into the interior volume 350 less) than those illustrated in FIG. 3-1, and there are less fins 354 than in FIG. 3-1. The increase in surface area of FIG. 3-1 relative to FIG. 3-2 may compensate for the lower temperature gradient and lower heat transfer rate. In other examples, the thermal surface features may taper, move, twist (e.g., a helix), start or stop mid-way along the longitudinal length, or have perforations or surface textures thereon along the longitudinal length of the radiator 334 to adjust the surface area of the inner surface of the radiator 334 to balance thermal transfer into the radiator 334 along the length of the radiator 334.

Referring now to FIG. 4, a variety of thermal surface features may be used. In some embodiments, the thermal surface features include rods 456 that extend into the interior volume 450 of the radiator 434. The rods 456 may be solid rods that provide an increase in surface area for radiator walls 452. In some embodiments, the thermal surface features include heat pipes 458, which transfer heat efficiently and increase surface area of the radiator walls 452.

In at least one embodiment, the radiator 434 includes an outer thermal surface feature 460 on an outer surface of the radiator 434 to cool the ambient air immediately surrounding the radiator 434. For example, an outer thermal surface feature 460 of the radiator 434 may allow an ambient fan or other fan outside of the radiator 434 to blow the cooled air (cooled by the outer thermal surface feature 460) away from the radiator 434 and over the motherboard or other components of the server blade. While FIG. 4 depicts an embodiment of a radiator 434 with a heat pipe outer thermal surface feature 460, it should be understood than any thermal surface feature or combination thereof may be used as an outer thermal surface feature 460.

Figure 5:
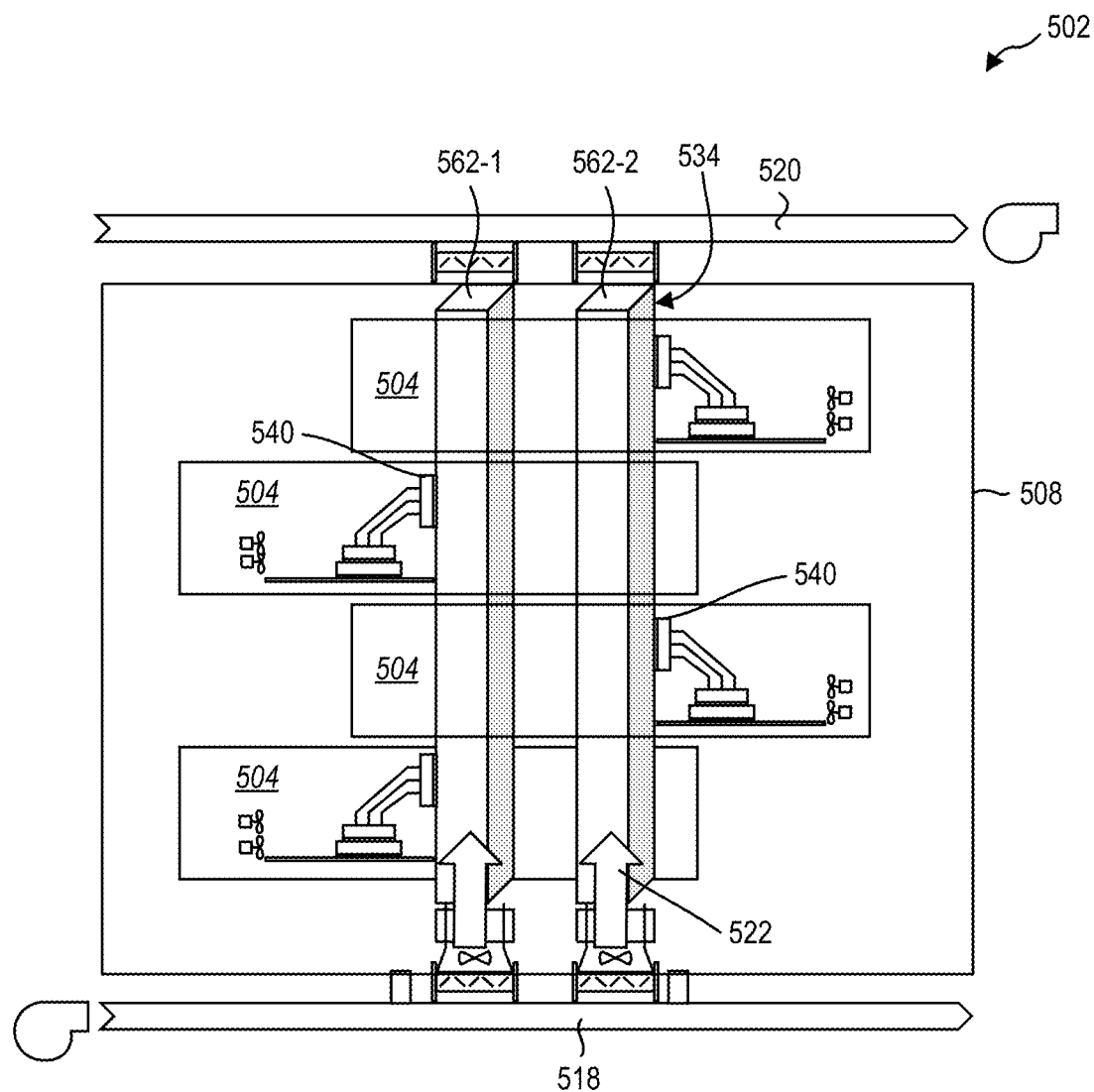
FIG. 5 is a side view of another hybrid radiator thermal management system, according to at least some embodiments of the present disclosure.

FIG. 5 is a schematic representation of an embodiment of a thermal management system 502 with a radiator 534 including two columns 562-1, 562-2. As described herein, the air 522 provided from the cold aisle 518 through the radiator 534 warms as the air 522 receives heat from the server blades 508 and components thereof. In some embodiments, a radiator 534 includes separate columns 562-1, 562-2 to distribute the air 522 between the two columns 562-1, 562-2 and isolate the heat transferred to the air 522 therein. For example, each of the first column 562-1 and the second column 562-2 have two of the four radiator heat sinks 540 connected thereto. Reducing the number of radiator heat sinks 540 connected to the outer surface of the column 562-1, 562-2 reduces the amount of heat transferred to the air 522 therein. Further, the radiator heat sinks 540 are staggered to alternate to which column 562-1, 562-2 each neighboring radiator heat sink 540 is connected. By longitudinally spacing the radiator heat sinks 540 connected to each column 562-1, 562-2, the thermal gradients may be further improved.

Figure 6:
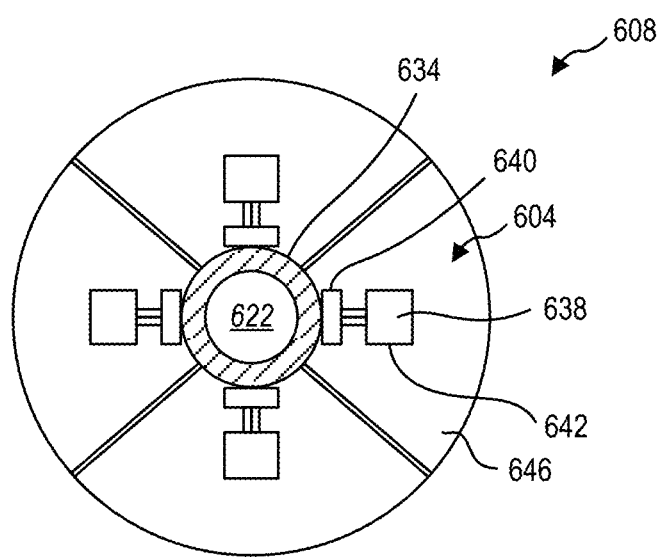
FIG. 6 is a top view of a radial hybrid radiator thermal management system, according to at least some embodiments of the present disclosure.

In some embodiments, the radiator 534 is a center column or center radiator 534 in a rack 508. To efficiently use the available space and surface area of the radiator, server blades 504 may be positioned on and connected to opposite sides of the radiator 534, such as illustrated in FIG. 5. In some embodiments, such as illustrated in the transverse cross-sectional view (top view) of FIG. 6, a rack 608 includes radially positioned server blades 604 around a central radiator 634. In some embodiments, the radiator 634 may provide and/or be the structural support to which the server blades 604 are connected. By supporting the server blades 604 through a direct mounting to the radiator 634, the radiator 634 may provide not only cooling, but function as a center spine for the rack 608. The air 622 flows through the center of the radiator 634, cooling the radiator 634 and receiving heat from the radiator heat sinks 640 connected to the outer surface of the radiator 634.

A radial arrangement of server blades may use conventional server blades 604 staggered radially and longitudinally (e.g., helixed) around the central radiator 634. In some embodiments, the server blades 604 may have wedge-shaped motherboards 646 to provide a more efficient surface area for components and cooling. A plurality of wedge-shaped server blades 604 may, when installed on the radiator 634, form a complete disc or circle (or other shape) around the radiator 634. In some embodiments, a wedge-shaped motherboard 646 allows for the CPU or other component to which the source heat sink 638 is connected to be positioned on the motherboard 646 near the radiator 634. Greater freedom in component location on the motherboard 646 can allow for shorter heat pipes 642 or other thermal conductor between the source heat sink 638 and the radiator heat sink 640 to efficiently transfer heat.

Figure 7:
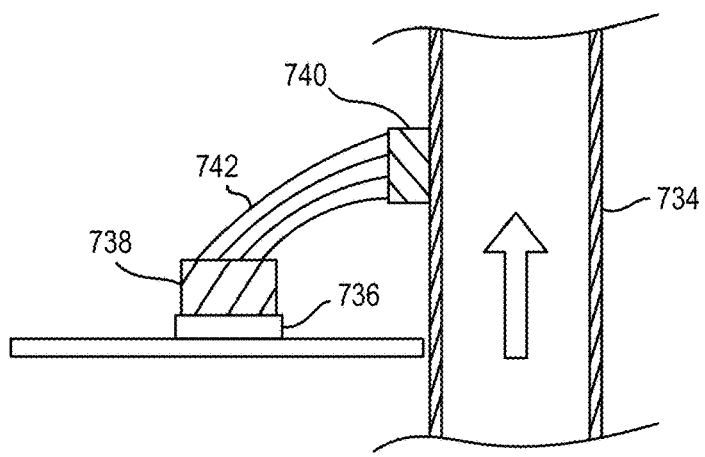
FIG. 7 is a detail view of a heat pipe thermal connector, according to at least some embodiments of the present disclosure.
Figure 8:
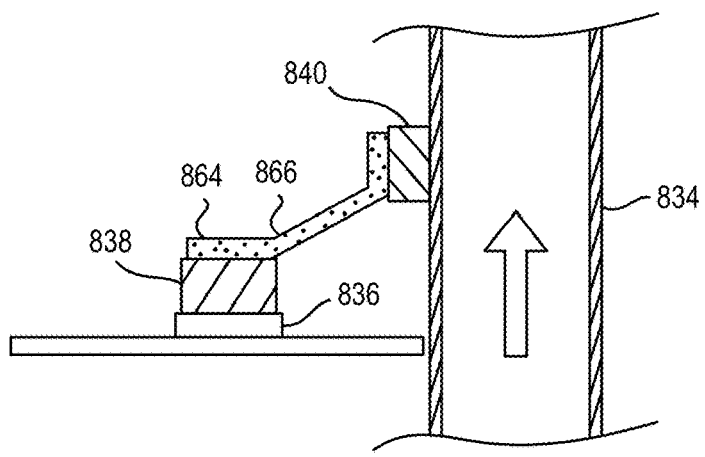
FIG. 8 is a detail view of a vapor chamber thermal connector, according to at least some embodiments of the present disclosure.
Figure 9:
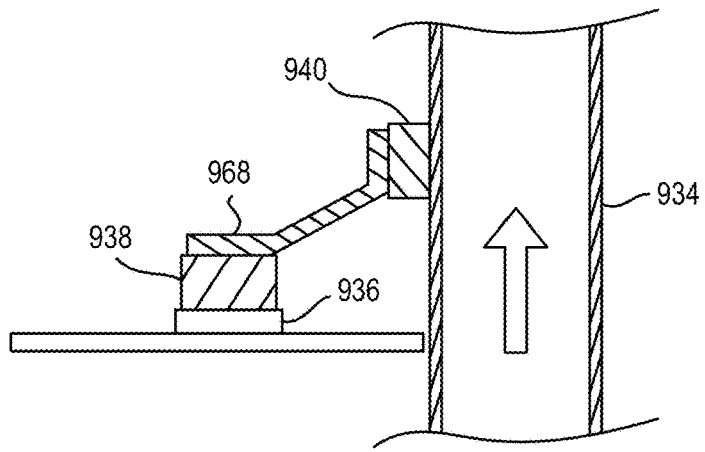
FIG. 9 is a detail view of a conductive rod thermal connector, according to at least some embodiments of the present disclosure.

FIG. 7 through FIG. 9 are side cross-sectional views of embodiments of thermal conductors to thermally conductively connect heat sources to the radiator 734. FIG. 7 illustrates an embodiment of a motherboard CPU 736 with source heat sink 738 thereon. The source heat sink 738 is thermally conductively connected to the radiator 734 by a plurality of heat pipes 742 and a radiator heat sink 740. FIG. 8 illustrates an embodiment of a motherboard CPU 836 with source heat sink 838 thereon. The source heat sink 838 is thermally conductively connected to the radiator 834 by a vapor chamber 864 and a radiator heat sink 840. The vapor chamber 864 includes a working fluid 866 therein that further improved heat transfer between the source heat sink 838 and the radiator heat sink 840. FIG. 9 illustrates an embodiment of a motherboard CPU 936 with source heat sink 938 thereon. The source heat sink 938 is thermally conductively connected to the radiator 934 by a solid thermally conductive rod 968 (or another solid element) and a radiator heat sink 940.

Figure 10:
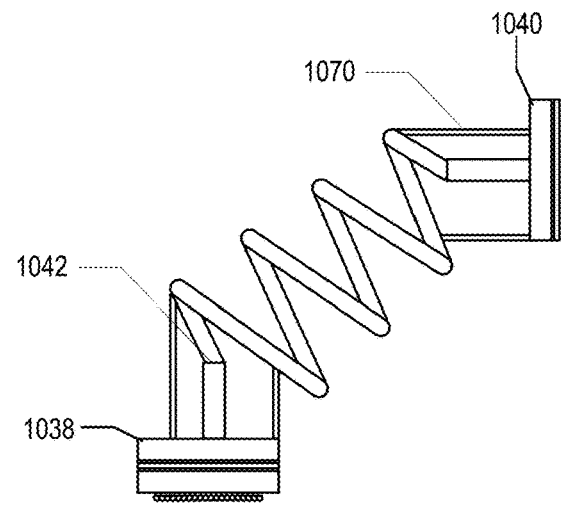
FIG. 10 is a schematic view of a thermal management system with an elastically deformable thermal conductor, according to at least some embodiments of the present disclosure.
Figure 11:
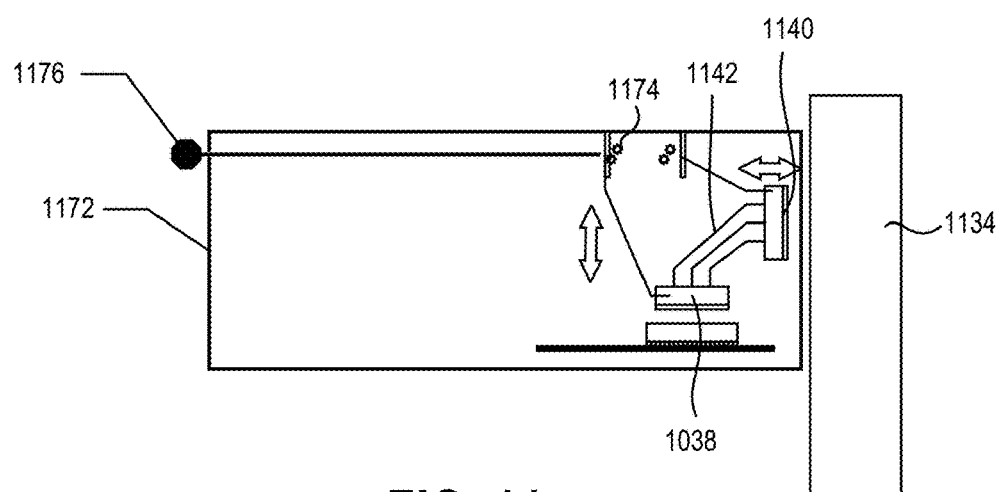
FIG. 11 is a schematic view of a moveable thermal conductor and heat sinks, according to at least some embodiments of the present disclosure.
Figure 12:
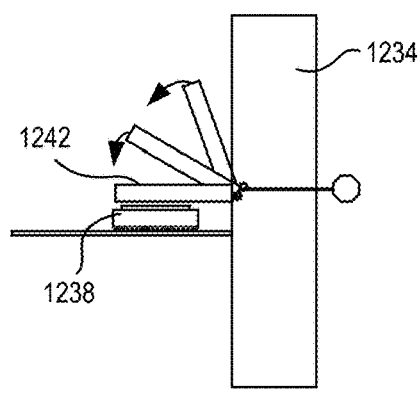
FIG. 12 is a schematic view of a rotatable thermal conductor, according to at least some embodiments of the present disclosure.

FIG. 10 through 12 are schematic illustrations of connection mechanisms to thermally conductively connect the heat-generating components of the server blade to the radiator. As described herein, the server blades may be selectively removable from or installable into the rack and/or radiator thermal management system. To facilitate the selective installation of the server blades, the thermal conductor may be disconnected from the heat-generating component, the radiator, or both. For example, the thermal conductor may be selectively connectable to the source heat sink and/or the radiator heat sink. In some examples, the radiator heat sink may be selectively connectable to the radiator. In some examples, the source heat sink may be selectively connectable to the heat-generating component.

In some embodiments, a spring-loaded mechanism connects the source heat sink to radiator heat sink. FIG. 10 illustrates an embodiment of a thermal management system with an elastically deformable thermal conductor, such as a heat pipe 1042. The elastically deformable thermal conductor may be a coiled heat pipe that allows the heat pipe to function as a spring. The heat pipe assembly between the source heat sink 1038 and the radiator heat sink 1040 follows a spring/helix structure that is elastically compressible at least 3 centimeters. In some embodiments, the source heatsink 1038 is attached to the heat-generating component while the radiator heat sink 1040 is self-supported by one or more supports 1070. The transverse action pushing in the server blade will convert to a pressure action on the spring via the elastic deformation thereof to provide the compression for thermal contact between both heat sinks 1038, 1040.

In some embodiments, a thermal conductor and/or heat sinks are connected to and supported by a frame of the rack or server chassis, allowing the assembly to be mechanically moved into place after the server blade installation onto the rack. FIG. 11 is a schematic representation of a thermal management system with a movable thermal conductor 1142 and heat sinks 1138, 1140 that are selectively connectable to the heat-generating component and the radiator 1134.

In FIG. 11, the thermal conductor 1142 and heat sinks 1138, 1140 are attached to the server chassis 1172. A cantilever mechanism 1174 supports the thermal conductor 1142 (which may be elastic or inelastic, such as heat pipes) and can be extended and/or retracted by either manual or motorized operation, such as by an external actuator 1176. The cantilever or other movement mechanism 1174 provides for contact between the heat-generating component and the column radiator 1134. In some embodiments, the cantilever or other movement mechanism 1174 moves the radiator heat sink 1140 and/or at least a portion of the thermal conductor 1142 toward the radiator 1134 after the server blade is inserted into the rack. For example, after the server blade and chassis 1172 are inserted into and connected to the rack, the server chassis 1172 may provide a rigid mechanical ground for the cantilever mechanism 1174 to apply a force to the radiator heat sink 1140 and compress the radiator heat sink 1140 against the radiator 1134. In some embodiments, the cantilever or other movement mechanism 1174 moves the source heat sink 1138 and/or at least a portion of the thermal conductor 1142 toward the heat-generating component after the server blade is inserted into the rack. During storage, transport, or installation of the server blade, the heat-generating component may be at risk of damage from the mass of the source heat sink, thermal conductor, and radiator heat sink applying forces to the heat-generating component due to their mass. Disconnecting the source heat sink 1138 and/or the thermal conductor 1142 from the heat-generating component during storage, transport, or installation may protect the heat-generating component. After installation of the server blade into the rack, the server chassis 1172 may provide a rigid mechanical ground for the cantilever mechanism 1174 to apply a force to the source heat sink 1138 and compress the source heat sink 1138 against the heat-generating component after all individual components are stable and connected to the rack.

In some embodiments, the thermal conductor and/or radiator heat sink are connected to and/or integrally formed with the radiator. The thermal conductor may be selectively connected to the source heat sink, or the source heat sink may be coupled to the thermal conductor and selectively connected to the heat-generating component. In some embodiments, a thermal conductor that is connected to or part of the radiator itself can be mechanically lowered onto the heat-generating component after installation of the server blade.

FIG. 12 is a schematic representation of a server blade with a heat-generating component, with a source heat sink 1238 thereon, positioned adjacent to a radiator 1234. The radiator 1234 includes a thermal conductor 1242 that is deployable from proximate the radiator 1234 toward the heat-generating component to thermally conductively connect the heat-generating component to the radiator 1234. In some embodiments, the thermal conductor 1242 is part of the column radiator 1234 that can be cantilevered onto the source heat sink 1238. The joint 1278 of the movable thermal conductor 1242 may allow heat transfer via additional thermal conducting materials, such as copper mesh or elastic thermal conducting elements, that provide reduced thermal conduction between the source heat sink 1238 and column radiator 1234. In some embodiments, the thermal conductor 1242 is movable via manual or motorized operation.

INDUSTRIAL APPLICABILITY

The present disclosure relates generally to systems and methods for protecting electronic devices from thermal damage. More particularly, the present disclosure relates to devices, systems, and methods for cooling server blades using a column radiator to air cool select components, such as a central processing unit (CPU) or memory (random access memory) of a server blade. In some embodiments, a central column radiator with a closed cold aisle connection is used in conjunction with ambient fans that blow ambient air over the remainder of the server blade.

Datacenters include a plurality of electronic devices, some of which are computing devices and some of which are not, that all generate thermal energy. The thermal energy needs to be transported away from the electronic devices to prevent damage to the electronic devices and/or protect the integrity of the data stored or computed on the electronic devices. Datacenters use thermal management systems to carry thermal energy away from the electronic devices by liquid cooling, air cooling, or a combination thereof. Even in liquid cooled systems, the liquid cooling may efficiently conduct thermal energy from the electronic devices but ultimately reject the thermal energy from the warmed liquid (or vapor) into the ambient atmosphere. The warmed ambient air must then be moved from the liquid cooling system and/or the electronic devices to complete the thermal management of the electronic devices, which may be inefficient.

In some embodiments of datacenters and thermal management systems according to the present disclosure, a plurality of heat generating devices are located in an enclosed space and air is moved through a radiator to transfer heat from the heat-generating devices to cool the heat-generating devices. While the present disclosure will describe the use of airflow to cool heat-generating devices directly, such as cooling computing devices, hardware storage devices, networking devices, power supplies, and other electronic devices, it should be understood that the thermal management system may use liquid cooling fluid flow to cool heat sinks of heat-generating components. In some embodiments, the column radiator is subcooled below the ambient air temperature, and select heat-generating components are thermally conductively connected to the radiator to conductively exhaust waste heat from the heat-generating component.

An example environment in which thermal management systems and methods according to the present disclosure may be used is a server array. In some embodiments, a datacenter includes server computers arranged in a row, where the row contains a plurality of server racks, each of which contain at a plurality of server computers, power supplies, networking devices, and other electronic devices. In some examples, the server computer is a blade server. In some examples, the server computers are complete computers (e.g., each server computer can function as a standalone computer). In some examples, the server computers are electronic components that can cooperate to provide scalable computational power.

The server row can include a row manager that is in communication with the server racks and/or rack manager of the server row. In some embodiments, the row manager controls computational loads, such as process allocations, of the server racks and/or server computers. In doing so, the row manager may control the amount of heat generated by the server computers of the server racks. In some embodiments, the row manager controls thermal management of the server racks and/or server computers. For example, the row manager can manage active thermal management for the server racks and/or server computers by changing fan speed or by controlling the flow rate of a cooling fluid for liquid cooling systems. In at least one example, the server row is at least partially cooled by a liquid cooling system that delivers cooling fluid to the server racks of the server row. The row manager is in communication with the cooling fluid pump to change or stop the flow of cooling fluid.

A server rack can support a plurality of server computers in the rack. The server computers may each have liquid cooling, such as localized immersion cooling for at least some electronic components of the server computer, or a cooling plate with recirculating cooling fluid to cool the electronic component(s) of the server computer. In some embodiments, the server computers or other electronic devices may be air-cooled, utilizing a cold aisle and a hot aisle that flow colder air from the cold aisle and evacuate hotter air from the electronic devices through the hot aisle. The air flows from the cold aisle to the hot aisle based on air pressure differentials established by pumps or blowers of the thermal management system in series with the cold aisle and the hot aisle.

In some embodiments, the electronic components, such as server computers, of the server rack are in data communication with a rack manager. The rack manager may control power delivery to the server computers or other electronic components. In some embodiments, the rack manager may communicate with the server computers or other electronic components to power cap or throttle the server computers or other electronic components and manage power draw. The rack manager, in some embodiments, is also in communication with a cooling fluid pump that moves cooling fluid to one or more server computers or other electronic components in the server rack.

A system resource manager may be in data communication with the row manager and/or rack manager(s) to communicate with the electronic devices, as well as be in communication with thermal sensors to measure one or more properties of the thermal management system. In some embodiments, the resource manager is the row manager. In some embodiments, the resource manager is the rack manager. In some embodiments, the resource manager is a dedicated controller.

The system resource manager includes a processor and a hardware storage device. The processor may receive information from the thermal sensors and communicate with one or more other devices according to instructions stored on the hardware storage device that cause the processor to perform any of the methods described herein. In some embodiments, the devices in communication with the system resource manager that may receive instructions from the system resource manager in response to detecting an increase in temperature include a cooling fluid pump, fan, valve, or another thermal management device (e.g., blower). For example, the system resource manager may adjust the flow of cooling fluid by turning on the cooling fluid pump or by actuating a valve to direct airflow.

The hardware storage device can be any non-transient computer readable medium that may store instructions thereon. The hardware storage device may be any type of solid-state memory; volatile memory, such as static random access memory (SRAM) or dynamic random access memory (DRAM); non-volatile memory, such as read-only memory (ROM) including programmable ROM (PROM), erasable PROM (ERPOM) or EEPROM; magnetic storage media, such as magnetic tape; a platen-based storage device, such as hard disk drives; optical media, such as compact discs (CD), digital video discs (DVD), Blu-ray Discs, or other optical media; removable media such as USB drives; non-removable media such as internal SATA or non-volatile memory express (NVMe) style NAND flash memory; or any other non-transient storage media.

The air is provided to the entire row and/or rack to cool the ambient air around the components of the rack. Cooling the entire environment may not be necessary and, in fact, inefficient, when the heat generation by the components of the server computers and other electronic devices is uneven. For example, a central processing unit (CPU) or system memory of the server computer may generate considerably greater heat than a non-volatile storage device. To limit and/or prevent thermal damage to the CPU, however, the entire ambient air is cooled based off of the CPU temperature and load. Localized cooling can efficiently cool the hottest areas and/or components without expending additional energy to cool the entire room in which the row or rack is located.

In some embodiments, a thermal management system according to the present disclosure provides localized cooling for the greatest heat-generating components of the server blades. A hybrid thermal management system uses a shared radiator to provide a subcooled heat sink in addition to the ambient air. In some embodiments, the radiator has an interior volume through which subcooled air or other gas flows to cool the radiator. In some embodiments, a cooling liquid is pumped through the radiator to cool the radiator. Select heat-generating components, such as processors (e.g., CPU, graphical processing unit (GPU)), system memory (e.g., RAM), network connection devices, and power supplies, are thermally conductively connected to the radiator to conduct heat away from the components to the cold radiator. The rest of the components, which generate less heat, on the motherboard are cooled via ambient air and/or fans to blow ambient air across those components.

In some embodiments, a thermal management system includes a rack of server computers or server blades. A rack manager or other controller is in data communication with thermal sensors and control structures for controlling the flow of air through the radiator. As described above, the radiator may be gas-cooled or liquid-cooled. While the present disclosure will describe the thermal management system as using air, it should be understood that other cooling fluids may be used. The air flowing through the radiator cools the radiator. In some embodiments, the radiator connects the cold aisle, through the radiator, to the hot aisle. The air warms as the radiator receives heat from the heat-generating components, such as the CPU of each blade. While some embodiments have the radiator oriented vertically to connect the cold aisle to the hot aisle, the radiator may be positioned at other orientations. For example, at least a portion of the radiator may be oriented at an angle to the direction of gravity. In some examples, at least a portion of the radiator may be oriented horizontally. In some examples, at least a portion of the radiator may be curved or have a corner therein. In at least one example, the radiator may provide cold air across a plurality of racks.

The heat-generating component, such as the CPU, is thermally conductively connected to the radiator by a thermal conductor. In some embodiments, a thermally conductor is a solid structure that conducts heat from the heat-generating component to the radiator within convective or radiative thermal interfaces. A thermally conductively connected element does not rely upon heat transfer through the air or other medium, but rather is physically connected to the radiator.

The thermal conductor includes at least one source heat sink positioned in contact with the heat-generating component. In some embodiments, a thermal paste or other interface material is positioned between the source heat sink and the heat-generating component to fill gaps and/or provide a thermally efficient interface.

The source heat sink may be thermally conductively connected to a radiator heat sink in contact with the radiator. In some embodiments, the source heat sink may be thermally conductively connected with the radiator directly, such as having one or more thermal conductors integrally formed with the radiator. In some embodiments, the radiator heat sink has an interface material positioned between the radiator heat sink and the radiator.

In some embodiments, and as will be described in greater detail below, the source heat sink is thermally conductively connected to the radiator and/or radiator heat sink by a thermal conductor. The thermal conductor may be or include a heat pipe, vapor chamber, solid thermally conductive rods or fins, or combinations thereof. In some embodiments, each of the server blades has a source heat sink that is thermally conductively connected to a radiator heat sink by heat pipes. In some embodiments, the source heat sink is thermally conductively connected to the radiator heat sink by a plurality of heat pipes or other thermal conductors. In some embodiments, the source heat sink is thermally conductively connected to the radiator heat sink by a single heat pipe or other thermal conductor. For example, the number and/or size of the thermal conductor may be related to the distance from the source heat sink to the radiator or radiator heat sink.

A rank manager may be in communication with one or more components of the rack. In some embodiments, the rack manager is the resource manager. In some embodiments, a dedicated controller is in communication with one or more radiator blowers and/or ambient fans. The radiator blower may be positioned and configured to flow air (or other cooling fluid) through the radiator between the cold aisle and the hot aisle. In some embodiments, the thermal management system includes a plurality of radiator blowers, such as a first radiator blower proximate the cold aisle and a second radiator blower proximate the hot aisle.

The ambient fans may be positioned on or proximate to the blade to blow ambient air across a surface of the motherboard and/or lower heat-generating components of the server blade. For example, the server blade may include non-volatile memory, such as a magnetic platen hard disk drive. The magnetic platen hard disk drive may require fewer cooling resources than the CPU, and the ambient air may provide sufficient cooling capacity to cool the magnetic platen hard disk drive without being thermally conductively connected to the radiator. In some embodiments, such the ambient fan(s) are positioned and oriented to blow ambient air from the room into the server blade and toward the radiator. In at least one embodiment, the ambient fan is positioned proximate the radiator to blow ambient air cooled by the surface of the radiator away from the radiator across the server blade and/or motherboard to cool the motherboard and components thereon.

The rack manager or other resource manager controller may be in communication with the thermal sensor(s) and adjust the radiator blower and/or ambient fans according to measurements from the thermal sensor(s). For example, the CPU is passively thermally conductively connected to the radiator, and additional cooling capacity to the CPU can be provided by cooling the radiator to increase the temperature gradient across the thermal conductor (e.g., heat pipes). If a thermal sensor positioned on the CPU or on an interface with the CPU measures a CPU temperature approaching or exceeding a threshold temperature, the rack manager or other resource manager controller may send a signal to the radiator blower to increase the flow of air through the radiator from the cold aisle to further cool the radiator.

In another example, a thermal sensor positioned on the motherboard may measure a motherboard temperature that is approaching or exceeding a threshold temperature. The rack manager or other resource manager controller may send a signal to the ambient fan(s) to blow ambient air across the motherboard and/or other components toward or away from the radiator to cool the motherboard and/or other components.

In some embodiments, the radiator heat sink is selectively connected to the radiator, allowing the radiator heat sink and the server blade to be disconnected from the radiator and/or rack for replacement or maintenance. For example, the server blade may slide into the rack toward the radiator during installation. The server blade may include a source heat sink and radiator heat sink installed on the server blade 204. When the server blade is urged into the rack, the server blade may electrically connect to a power supply and/or networking components and, at the same time, connect the radiator heat sink to the radiator.

To provide efficient convective heat transfer between the air in the interior volume of the radiator and the radiator walls, the radiator may include one or more thermal surface features to increase surface area of an inner or outer surface of the radiator. In some embodiments, the radiator has an interior volume through which the air from the cold aisle flows. The air from the cold aisle cools the radiator walls to which a radiator heat sink or thermal conductor may be connected. The radiator includes one or more thermal surface features to increase the surface area of the inner surface of the radiator walls and more efficiently transfer heat between the air and radiator walls and cool the radiator walls. In some embodiments, the thermal surface features include fins oriented in the longitudinal direction of the radiator (e.g., the direction of airflow through the interior volume). By orienting the fins in the direction of airflow, the resistance to the air is minimized while exposing a larger surface area of the fins to the air.

In some embodiments, the air warms as the air flows through the radiator, which decreases the temperature gradient between the air and the radiator. A decrease in the temperature gradient can decrease heat transfer rates. To compensate for the warming of the air along the longitudinal length of the radiator, the thermal surface features can vary in size, shape, or type along the longitudinal direction of the radiator. For example, another transverse cross-section of the same radiator at a different longitudinal position in the radiator may have a different shape or thermal surface features thereon. Where the radiator is proximate the cold aisle (e.g., where the air is coldest in the radiator), the fins are shorter (e.g., protrude into the interior volume less) than those proximate the hot aisle, and there may be less fins than proximate the hot aisle. The increase in surface area proximate the hot aisle relative to the cold aisle may compensate for the lower temperature gradient and lower heat transfer rate. In other examples, the thermal surface features may taper, move, twist (e.g., a helix), start or stop mid-way along the longitudinal length, or have perforations or surface textures thereon along the longitudinal length of the radiator to adjust the surface area of the inner surface of the radiator to balance thermal transfer into the radiator along the length of the radiator.

A variety of thermal surface features may be used. In some embodiments, the thermal surface features include rods that extend into the interior volume of the radiator. The rods may be solid rods that provide an increase in surface area for radiator walls. In some embodiments, the thermal surface features include heat pipes, which transfer heat efficiently and increase surface area of the radiator walls.

In at least one embodiments, the radiator includes an outer thermal surface feature on an outer surface of the radiator to cool the ambient air immediately surrounding the radiator. For example, an outer thermal surface feature of the radiator may allow an ambient fan or other fan outside of the radiator to blow the cooled air (cooled by the outer thermal surface feature) away from the radiator and over the motherboard or other components of the server blade. It should be understood than any thermal surface feature or combination thereof may be used as an outer thermal surface feature.

In some embodiments of a thermal management system, a radiator includes a plurality of columns. As described herein, the air provided from the cold aisle through the radiator warms as the air receives heat from the server blades and components thereof. In some embodiments, a radiator includes separate columns to distribute the air between the columns and isolate the heat transferred to the air therein. For example, each of a first column and a second column may have two of four radiator heat sinks connected thereto. Reducing the number of radiator heat sinks connected to the outer surface of the column reduces the amount of heat transferred to the air therein. Further, the radiator heat sinks may be staggered to alternate to which column each neighboring radiator heat sink is connected. By longitudinally spacing the radiator heat sinks connected to each column, the thermal gradients may be further improved.

In some embodiments, the radiator is a center column or center radiator in a rack. To efficiently use the available space and surface area of the radiator, server blades may be positioned on and connected to opposite sides of the radiator. In some embodiments, a rack includes radially positioned server blades around a central radiator. In some embodiments, the radiator may provide and/or be the structural support to which the server blades are connected. By supporting the server blades through a direct mounting to the radiator, the radiator may provide not only cooling, but function as a center spine for the rack. The air flows through the center of the radiator, cooling the radiator and receiving heat from the radiator heat sinks connected to the outer surface of the radiator.

A radial arrangement of server blades may use conventional server blades staggered radially and longitudinally (e.g., helixed) around the central radiator. In some embodiments, the server blades may have wedge-shaped motherboards to provide a more efficient surface area for components and cooling. A plurality of wedge-shaped server blades may, when installed on the radiator, form a complete disc or circle (or other shape) around the radiator. In some embodiments, a wedge-shaped motherboard allows for the CPU or other component to which the source heat sink is connected to be positioned on the motherboard near the radiator. Greater freedom in component location on the motherboard can allow for shorter heat pipes or other thermal conductor between the source heat sink and the radiator heat sink to efficiently transfer heat.

In some embodiments, the source heat sink is thermally conductively connected to the radiator by a plurality of heat pipes and a radiator heat sink. In some embodiments, the source heat sink is thermally conductively connected to the radiator by a vapor chamber and a radiator heat sink. The vapor chamber includes a working fluid therein that further improved heat transfer between the source heat sink and the radiator heat sink. In some embodiments, a source heat sink is thermally conductively connected to the radiator by a solid thermally conductive rod (or another solid element) and a radiator heat sink.

As described herein, the server blades may be selectively removable from or installable into the rack and/or radiator thermal management system. To facilitate the selective installation of the server blades, the thermal conductor may be disconnected from the heat-generating component, the radiator, or both. For example, the thermal conductor may be selectively connectable to the source heat sink and/or the radiator heat sink. In some examples, the radiator heat sink may be selectively connectable to the radiator. In some examples, the source heat sink may be selectively connectable to the heat-generating component.

In some embodiments, a spring-loaded mechanism connects the source heat sink to radiator heat sink. An elastically deformable thermal conductor may be a coiled heat pipe that allows the heat pipe to function as a spring. The heat pipe assembly between the source heat sink and the radiator heat sink follows a spring/helix structure that is elastically compressible at least 3 centimeters. In some embodiments, the source heatsink is attached to the heat-generating component while the surface in contact with the radiator heat sink is self-supported by one or more supports. The transverse action pushing in the server blade will convert to a pressure action on the spring via the elastic deformation thereof to provide the compression for thermal contact between both heat sinks.

In some embodiments, a thermal conductor and/or heat sinks are connected to and supported by a frame of the rack or server chassis, allowing the assembly to be mechanically moved into place after the server blade installation onto the rack. In some embodiments, a thermal management system with a movable thermal conductor and heat sinks are selectively connectable to the heat-generating component and the radiator.

A cantilever mechanism supports the thermal conductor (which may be elastic or inelastic, such as heat pipes) and can be extended and/or retracted by either manual or motorized operation. The cantilever or other movement mechanism provides for contact between the heat-generating component and the column radiator. In some embodiments, the cantilever or other movement mechanism moves the radiator heat sink and/or at least a portion of the thermal conductor toward the radiator after the server blade is inserted into the rack. For example, after the server blade and chassis are inserted into and connected to the rack, the server chassis may provide a rigid mechanical ground for the cantilever mechanism to apply a force to the radiator heat sink and compress the radiator heat sink against the radiator. In some embodiments, the cantilever or other movement mechanism moves the source heat sink and/or at least a portion of the thermal conductor toward the heat-generating component after the server blade is inserted into the rack. During storage, transport, or installation of the server blade, the heat-generating component may be at risk of damage from the mass of the source heat sink, thermal conductor, and radiator heat sink applying forces to the heat-generating component due to their mass. Disconnecting the source heat sink and/or the thermal conductor from the heat-generating component during storage, transport, or installation may protect the heat-generating component. After installation of the server blade into the rack, the server chassis may provide a rigid mechanical ground for the cantilever mechanism to apply a force to the source heat sink and compress the source heat sink against the heat-generating component after all individual components are stable and connected to the rack.

In some embodiments, the thermal conductor and/or radiator heat sink are connected to and/or integrally formed with the radiator. The thermal conductor may be selectively connected to the source heat sink, or the source heat sink may be coupled to the thermal conductor and selectively connected to the heat-generating component. In some embodiments, a thermal conductor that is connected to or part of the radiator itself can be mechanically lowered onto the heat-generating component after installation of the server blade.

In some embodiments, the radiator includes a thermal conductor that is deployable from proximate the radiator toward the heat-generating component to thermally conductively connect the heat-generating component to the radiator. In some embodiments, the thermal conductor is part of the column radiator that can be cantilevered onto the heat source. The joint of the movable thermal conductor may allow heat transfer via additional thermal conducting materials, such as copper mesh or elastic thermal conducting elements, that provide reduced thermal conduction between the heat plate and column radiator. In some embodiments, the thermal conductor is movable via manual or motorized operation.

The present disclosure relates to systems and methods for thermal management in a server rack according to at least the examples provided in the sections below:

[A1] In some embodiments, a thermal management system for cooling a computing device includes a cold aisle, a hot aisle, a radiator, and a plurality of source heat sinks thermally conductively connected to the radiator. The radiator connects the cold aisle to the hot aisle and flows a cooling fluid through an interior volume of the radiator. Each source heat sink is configured to connect to a heat-generating electronic component to thermally conductively connect the heat-generating component to a surface of the radiator.

[A2] In some embodiments, the thermal management system of [A1] includes a radiator heat sink contacting a surface of the radiator and thermally conductively connected to the source heat sink.

[A3] In some embodiments, the source heat sink of [A2] is thermally conductively connected to the radiator heat sink by a heat pipe.

[A4] In some embodiments, the radiator heat sink of [A2] or [A3] is selectively connected to the radiator to allow removal of the source heat sink thermally conductively connected to the radiator.

[A5] In some embodiments, the radiator of any of [A1] through [A4] is a column radiator.

[A6] In some embodiments, the cooling fluid of any of [A1] through [A5] is air.

[A7] In some embodiments, the radiator of any of [A1] through [A6] includes a plurality of thermal surface features on an inner surface thereof.

[A8] In some embodiments, the radiator of any of [A1] through [A7] includes a plurality of thermal surface features on an outer surface thereof.

[A9] In some embodiments, the thermal management system of any of [A1] through [A8] includes an ambient fan to blow ambient air toward the radiator.

[A10] In some embodiments, the thermal management system of any of [A1] through [A9] includes an ambient fan to blow ambient air away from the radiator.

[B1] In some embodiments, a thermal management system includes a cold aisle, a hot aisle, a radiator, a plurality of source heat sinks thermally conductively connected to the radiator, and an ambient fan positioned and configured to blow ambient air toward at least one of the source heat sinks. The radiator connects the cold aisle to the hot aisle and flows a cooling fluid through an interior volume of the radiator. Each source heat sink is configured to connect to a heat-generating electronic component to thermally conductively connect the heat-generating component to a surface of the radiator.

[B2] In some embodiments, the thermal management system of [B1] includes a thermal sensor and a controller in data communication with the thermal sensor and the ambient fan. The thermal sensor is positioned at the heat-generating electronic component to measure a temperature of the heat-generating electronic component. The controller is configured to adjust the ambient fan based at least partially on a measurement from the thermal sensor.

[B3] In some embodiments, the controller of [B2] is part of a rack manager.

[B4] In some embodiments, the controller of [B2] or [B3] is also in communication with a radiator blower and configured to adjust the radiator blower based at least partially on a measurement from the thermal sensor.

[B5] In some embodiments, the thermal management system of any of [B1] through [B4] includes a plurality of server blades. Each server blade includes one or more of the heat-generating electronic components. At least two of the plurality of server blades are positioned on opposite sides of the radiator.

[B6] In some embodiments, at least a portion of the plurality of server blades of [B5] is positioned radially around the radiator.

[B7] In some embodiments, the radiator of any of [B1] through [B6] is a round column radiator.

[C1] In some embodiments, a thermal management system for cooling computing devices includes a cold aisle, a hot aisle, a radiator, and a plurality of server blades. The radiator connects the cold aisle to the hot aisle and flows a cooling fluid through an interior volume of the radiator. Each server blade of the plurality of server blades includes a heat-generating component, a source heat sink, and an ambient fan. The source heat sink is positioned on the heat-generating component and thermally conductively connected to the radiator. The ambient fan is positioned and configured to blow ambient air toward at least one of the source heat sinks.

[C2] In some embodiments, the radiator of [C1] includes a plurality of columns, and each column connects the cold aisle to the hot aisle. A first source heat sink of a first server blade of the plurality of server blades is thermally conductively connected to a first column. A second source heat sink of a second server blade of the plurality of server blades is thermally conductively connected to a second column.

[C3] In some embodiments, the radiator of [C1] or [C2] includes at least one thermal surface feature on an inner surface thereof that changes in at least one dimension in a longitudinal direction of the radiator.

The articles "a," "an," and "the" are intended to mean that there are one or more of the elements in the preceding descriptions. The terms "comprising," "including," and "having" are intended to be inclusive and mean that there may be additional elements other than the listed elements. Additionally, it should be understood that references to "one embodiment" or "an embodiment" of the present disclosure are not intended to be interpreted as excluding the existence of additional embodiments that also incorporate the recited features. For example, any element described in relation to an embodiment herein may be combinable with any element of any other embodiment described herein. Numbers, percentages, ratios, or other values stated herein are intended to include that value, and also other values that are "about" or "approximately" the stated value, as would be appreciated by one of ordinary skill in the art encompassed by embodiments of the present disclosure. A stated value should therefore be interpreted broadly enough to encompass values that are at least close enough to the stated value to perform a desired function or achieve a desired result. The stated values include at least the variation to be expected in a suitable manufacturing or production process, and may include values that are within 5%, within 1%, within 0.1%, or within 0.01% of a stated value.

A person having ordinary skill in the art should realize in view of the present disclosure that equivalent constructions do not depart from the scope of the present disclosure, and that various changes, substitutions, and alterations may be made to embodiments disclosed herein without departing from the scope of the present disclosure. Equivalent constructions, including functional "means-plus-function" clauses are intended to cover the structures described herein as performing the recited function, including both structural equivalents that operate in the same manner, and equivalent structures that provide the same function. It is the express intention of the applicant not to invoke means-plus-function or other functional claiming for any claim except for those in which the words 'means for' appear together with an associated function. Each addition, deletion, and modification to the embodiments that falls within the meaning and scope of the claims is to be embraced by the claims.

It should be understood that any directions or reference frames in the preceding description are merely relative directions or movements. For example, any references to "front" and "back" or "top" and "bottom" or "left" and "right" are merely descriptive of the relative position or movement of the related elements.

The present disclosure may be embodied in other specific forms without departing from its characteristics. The described embodiments are to be considered as illustrative and not restrictive. The scope of the disclosure is, therefore, indicated by the appended claims rather than by the foregoing description. Changes that come within the meaning and range of equivalency of the claims are to be embraced within their scope.

What is claimed is:

1. A thermal management system for cooling a computing device, the thermal management system comprising:
   a cold aisle;
   a hot aisle;
   a radiator connecting the cold aisle to the hot aisle and configured to flow a cooling fluid through an interior volume of the radiator, wherein the cooling fluid is air; and
   a plurality of source heat sinks thermally conductively connected to the radiator, wherein each source heat sink of the plurality of source heat sinks is configured to connect to a heat-generating electronic component.

2. The thermal management system of claim 1, further comprising a radiator heat sink contacting a surface of the radiator and thermally conductively connected to the source heat sink.

3. The thermal management system of claim 2, wherein the source heat sink is thermally conductively connected to the radiator heat sink by a heat pipe.

4. The thermal management system of claim 2, wherein the radiator heat sink is selectively connected to the radiator to allow removal of the source heat sink thermally conductively connected to the radiator.

5. The thermal management system of claim 1, wherein the radiator is a column radiator.

6. The thermal management system of claim 1, wherein the radiator includes a plurality of thermal surface features on an inner surface thereof.

7. The thermal management system of claim 1, wherein the radiator includes a plurality of thermal surface features on an outer surface thereof.

8. The thermal management system of claim 1, further comprising at least one ambient fan to blow ambient air toward the radiator.

9. The thermal management system of claim 1, further comprising at least one ambient fan to blow ambient air away from the radiator.

10. The thermal management system of claim 1, wherein the cooling fluid flows from the cold aisle, into the interior volume of the radiator, and into the hot aisle.

11. A thermal management system for cooling computing devices, the thermal management system comprising:
   a cold aisle;
   a hot aisle;
   a radiator connecting the cold aisle to the hot aisle and configured to flow a cooling fluid through an interior volume of the radiator, wherein the cooling fluid is air;
   a plurality of source heat sinks thermally conductively connected to the radiator, wherein each source heat sink of the plurality of source heat sinks is configured to connect to a heat-generating electronic component; and
   an ambient fan positioned and configured to blow ambient air toward at least one of the source heat sinks.

12. The thermal management system of claim 11, further comprising:
   a thermal sensor positioned at the heat-generating component; and
   a controller in data communication with the ambient fan and the thermal sensor, the controller configured to adjust the ambient fan based at least partially on a measurement from the thermal sensor.

13. The thermal management system of claim 12, wherein the controller is part of a rack manager.

14. The thermal management system of claim 12, wherein the controller is further in communication with a radiator blower and configured to adjust the radiator blower based at least partially on a measurement from the thermal sensor.

15. The thermal management system of claim 11, further comprising a plurality of server blades wherein each server blade includes one or more of the heat-generating electronic components, wherein at least two of the plurality of server blades are positioned on opposite sides of the radiator.

16. The thermal management system of claim 15, wherein at least a portion of the plurality of server blades is positioned radially around the radiator.

17. The thermal management system of claim 16, wherein the radiator is a round column radiator.

18. A thermal management system for cooling computing devices, the thermal management system comprising:
   a cold aisle;
   a hot aisle;
   a radiator connecting the cold aisle to the hot aisle and configured to flow a cooling fluid through an interior volume of the radiator, wherein the cooling fluid is air;
   a plurality of server blades, wherein each server blade includes:
      a heat-generating component,
      a source heat sink positioned on the heat-generating component and thermally conductively connected to the radiator, and
      an ambient fan positioned and configured to blow ambient air toward at least one of the source heat sinks.

19. The thermal management system of claim 18, wherein the radiator includes a plurality of columns, wherein each column connects the cold aisle to the hot aisle,
   wherein a first source heat sink of a first server blade of the plurality of server blades is thermally conductively connected to a first column, and
   wherein a second source heat sink of a second server blade of the plurality of server blades is thermally conductively connected to the second column.

20. The thermal management system of claim 18, wherein the radiator includes at least one thermal surface feature on an inner surface thereof that changes in at least one dimension in a longitudinal direction of the radiator.

\* \* \* \* \*